United States Patent
Jagadeesan et al.

(10) Patent No.: US 11,641,726 B1
(45) Date of Patent: May 2, 2023

(54) PIVOTABLE REMOVABLE FAN MODULE FOR A RACKMOUNT NETWORK DEVICE CHASSIS

(71) Applicant: Juniper Networks, Inc., Sunnyvale, CA (US)

(72) Inventors: Raveen Jagadeesan, Bangalore (IN); Suresh Anandan, Bangalore (IN); Senthil Kumar Ramaswamy Venkat, Bangalore (IN); Mruthyunjaya S, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 17/514,115

(22) Filed: Oct. 29, 2021

(51) Int. Cl.
*H05K 7/20* (2006.01)
*H05K 7/14* (2006.01)

(52) U.S. Cl.
CPC ....... *H05K 7/20172* (2013.01); *H05K 7/1417* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 6,549,406 B1 | 4/2003 | Olesiewicz | |
| 7,408,772 B2 * | 8/2008 | Grady | H05K 7/20581 361/679.48 |
| 7,481,704 B2 * | 1/2009 | Kao | F04D 25/166 415/214.1 |
| 10,231,361 B2 * | 3/2019 | Chen | H05K 7/20727 |
| 10,240,615 B1 * | 3/2019 | Kho | F04D 29/668 |
| 2006/0256522 A1 | 11/2006 | Wei | |
| 2020/0120408 A1 | 4/2020 | Boyd et al. | |

FOREIGN PATENT DOCUMENTS

WO   2008019038 A1   2/2008

OTHER PUBLICATIONS

Extended European Search Report for Application No. EP21217353, dated Jun. 20, 2022, 11 pages.

* cited by examiner

*Primary Examiner* — Mukundbhai G Patel
(74) *Attorney, Agent, or Firm* — Harrity & Harrity, LLP (57) ABSTRACT

A fan tray, for a fan module of a network device chassis, may include an inner assembly that includes an inner cassette, one or more fans connected to the inner cassette, a first latch connected to the inner cassette and configured to removably connect to an outer assembly of the fan tray, and a fan controller connected to the inner cassette and configured to control operation of the one or more fans. The outer assembly may be configured to receive and retain the inner assembly, and may include an outer cassette with one or more openings configured to communicate with the one or more fans, a second latch connected to the outer cassette and configured to removably connect to a rear portion of the network device chassis, and an adaptor connected to the outer cassette and configured to connect and provide power to the fan controller.

20 Claims, 9 Drawing Sheets

PIVOTABLE REMOVABLE FAN MODULE
FOR A RACKMOUNT NETWORK DEVICE
CHASSIS

BACKGROUND

A chassis is a structure (e.g., a rack) that is configurable with various types of network devices and/or network device components to provide a type and a quantity of required network ports. A chassis may include a quantity of fixed slots into which various types of network devices and/or network device components may be inserted.

SUMMARY

Some implementations described herein relate to a fan tray for a fan module of a network device chassis. The fan tray may include an inner assembly that includes an inner cassette, one or more fans connected to the inner cassette, a first latch connected to the inner cassette and configured to removably connect to an outer assembly of the fan tray, and a fan controller connected to the inner cassette and configured to control operation of the one or more fans. The outer assembly may be configured to receive and retain the inner assembly, and may include an outer cassette with one or more openings configured to communicate with the one or more fans, a second latch connected to the outer cassette and configured to removably connect to a rear portion of the network device chassis, and an adaptor connected to the outer cassette and configured to connect and provide power to the fan controller.

Some implementations described herein relate to a chassis. The chassis may include one or more components of a network device, and a fan module that includes a plurality of fan trays. Each of the fan trays may include an inner assembly that includes an inner cassette, one or more fans connected to the inner cassette, a first latch connected to the inner cassette and configured to removably connect to an outer assembly of the fan tray, and a fan controller connected to the inner cassette and configured to control operation of the one or more fans. The outer assembly may be configured to receive and retain the inner assembly, and may include an outer cassette with one or more openings configured to communicate with the one or more fans, a second latch connected to the outer cassette and configured to removably connect to a rear portion of the chassis, and an adaptor connected to the outer cassette and configured to connect and provide power to the fan controller.

Some implementations described herein relate to a fan module of a network device chassis. The fan module may include a plurality of fan trays. Each of the fan trays may include an inner assembly that includes an inner cassette, one or more fans connected to the inner cassette, a first latch connected to the inner cassette and configured to removably connect to an outer assembly of the fan tray, and a fan controller connected to the inner cassette and configured to control operation of the one or more fans. The outer assembly may be configured to receive and retain the inner assembly, and may include an outer cassette with one or more openings configured to communicate with the one or more fans, a second latch connected to the outer cassette and configured to removably connect to a rear portion of the network device chassis, and an adaptor connected to the outer cassette and configured to connect and provide power to the fan controller.

DETAILED DESCRIPTION

The following detailed description of example implementations refers to the accompanying drawings. The same reference numbers in different drawings may identify the same or similar elements.

A chassis may be mounted inside a closed cabinet using telescopic rails and without rear access to components (e.g., network devices and/or network device components) supported by the chassis or may be mounted in a closed cabinet with rear access (e.g., a rear door) to the components supported by the chassis. A fan module with multiple replaceable fan trays may be connected to a rear portion of the components supported by the chassis. The multiple fan trays for the fan module may cool the components supported by the chassis. However, the fan module is not accessible from the rear of the closed cabinet without rear access and is not accessible from the front or the top of the closed cabinet with rear access (e.g., since telescopic rails are not provided). Thus, current fan module designs are unable to support both a closed cabinet with telescopic rails and without rear access to the fan module and a closed cabinet with rear access to the fan module. This may cause a delay in replacing and/or servicing the fan module and may consume computing resources (e.g., processing resources, memory resources, communication resources, and/or the like), networking resources, and/or the like associated with delaying traffic transmission through a network while the fan module is being replaced and/or serviced, losing traffic due to the delay in replacing and/or servicing the fan module, handling lost traffic due to the delay in replacing and/or servicing the fan module, increasing costs of parts, inventory, and labor associated with supporting two different cabinet configurations, and/or the like.

Some implementations described herein relate to a pivotable removable fan module for a rackmount network device chassis. For example, the fan module may include a plurality of fan trays. Each of the fan trays may include an inner assembly that includes an inner cassette, one or more fans connected to the inner cassette, a first latch connected to the inner cassette and configured to removably connect to an outer assembly of the fan tray, and a fan controller connected to the inner cassette and configured to control operation of the one or more fans. The outer assembly may be configured to receive and retain the inner assembly, and may include an outer cassette with one or more openings configured to communicate with the one or more fans, a second latch connected to the outer cassette and configured to removably connect to a rear portion of the network device chassis, and an adaptor connected to the outer cassette and configured to connect and provide power to the fan controller.

In this way, a pivotable removable fan module may be provided for a rackmount network device chassis. For example, the pivotable removable fan module may support both a closed cabinet with telescopic rails and without rear access to the fan module and a closed cabinet with rear access to the fan module. For the closed cabinet with the telescopic rails and without rear access to the fan module, a network device chassis may be moved forward, via the telescopic rails, from a rack until a top of the fan module is accessible. A fan tray of the fan module may be vertically removed and replaced via the top of the fan module. For a closed cabinet with rear access to the fan module, a fan tray of the fan module may be pivoted away from a rear portion of a network device chassis and may be removed and replaced via the rear of the fan module. Thus, the pivotable removable fan module prevents a delay in replacing and/or servicing the fan module and conserves computing resources, networking resources, and/or the like that would otherwise have been consumed by delaying traffic transmission through a network while the fan module is being replaced and/or serviced, losing traffic due to the delay in replacing and/or servicing the fan module, handling lost traffic due to the delay in replacing and/or servicing the fan module, increasing costs of parts, inventory, and labor associated with supporting two different cabinet configurations, and/or the like.

FIGS. 1A-1F are diagrams of an example 100 associated with pivotable removable fan module for a rackmount network device chassis. As shown in FIGS. 1A-1F, example 100 includes network device chassis 105 for supporting one or more network devices and a fan module 110. Further details of the network device chassis 105, the network devices, and the fan module 110 are provided elsewhere herein.

Figure 1A:
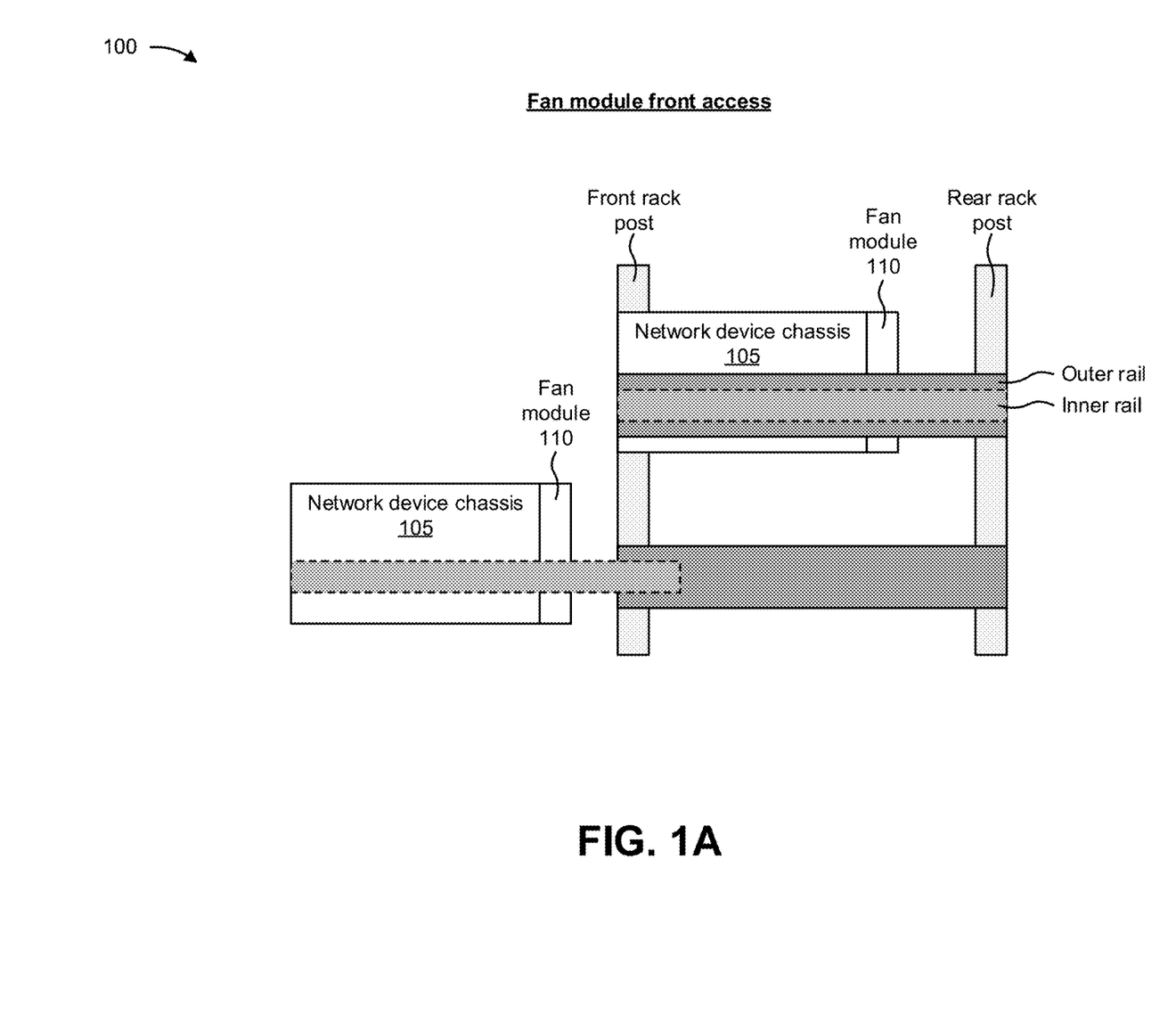
FIGS. 1A-1F are diagrams of an example associated with a pivotable removable fan module for a rackmount network device chassis.

FIG. 1A depicts network device chassis 105 mounted inside a closed cabinet using telescopic rails and without rear access to components (e.g., network devices and/or network device components) supported by the network device chassis 105. As shown in FIG. 1A, the closed cabinet may include a front rack post, a rear rack post, and outer rails connected to the front rack post and the rear rack post (e.g., on opposing sides of the front rack post and the rear rack post). Inner rails may be connected to an upper network device chassis 105 and a lower network device chassis 105 (e.g., on opposing sides of the network device chassis 105) and may be telescopically provided within corresponding outer rails.

As further shown in FIG. 1A, a fan module 110 may be connected to rear portions of the components supported by the upper network device chassis 105 and the lower network device chassis 105. The fan module 110 may include multiple replaceable fan trays that cool the components supported by the upper network device chassis 105 and the lower network device chassis 105. In order to service or replace a fan tray of the fan module 110 of the lower network device chassis 105, the lower network device chassis 105 may be pulled forward away from the front rack post, via the telescopic inner rails, until the fan module 110 clears the upper network device chassis 105, as shown in FIG. 1A. In order to service or replace a fan tray of the fan module 110 of the upper network device chassis 105, the upper network device chassis 105 may be pulled forward, away from the front rack post, via the telescopic inner rails, until the fan module 110 clears the front rack post.

Figure 1B:
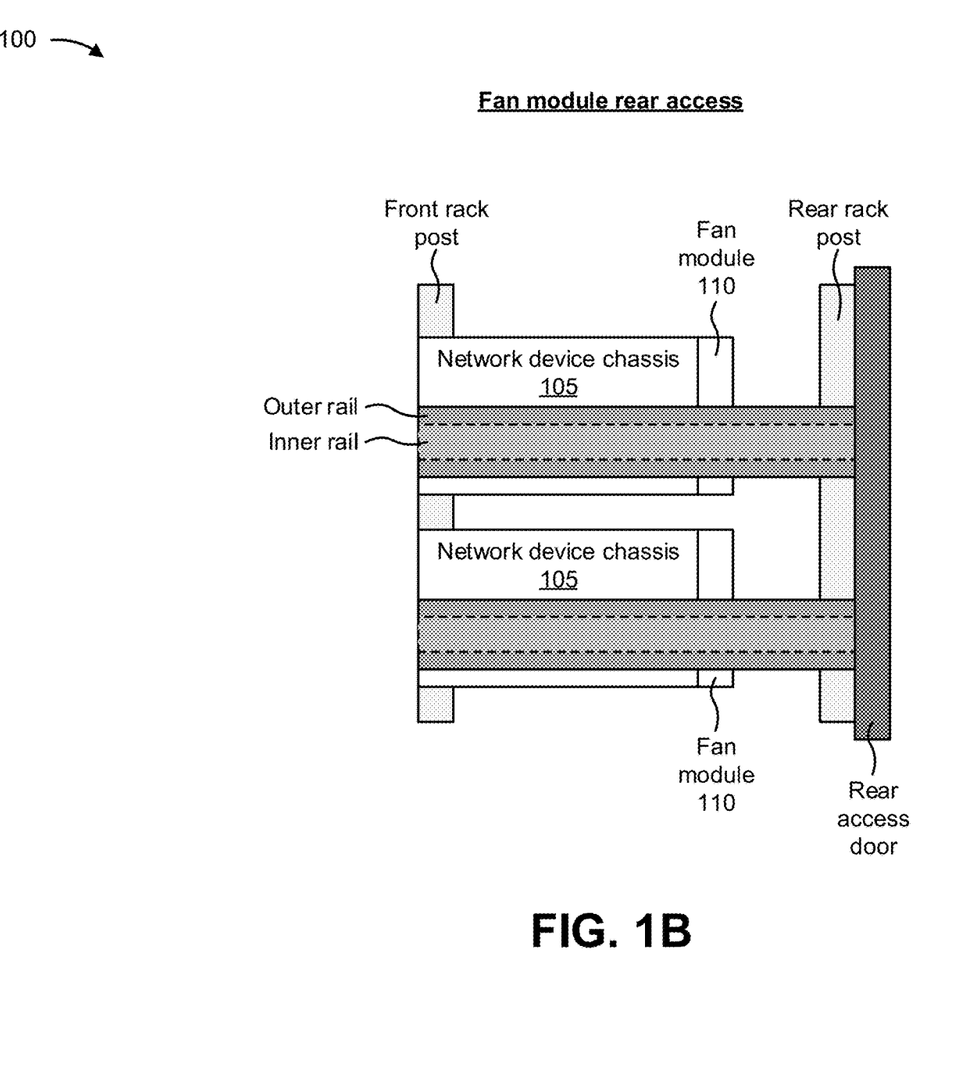

FIG. 1B depicts network device chassis 105 mounted inside a closed cabinet using telescopic rails and with rear access to components (e.g., network devices and/or network device components) supported by the network device chassis 105. As shown in FIG. 1B, the closed cabinet may include the front rack post, the rear rack post, the outer rails connected to the front rack post and the rear rack post (e.g., on opposing sides of the front rack post and the rear rack post), and a rear access door provided near the rear rack post. The inner rails may be connected to the upper network device chassis 105 and the lower network device chassis 105 (e.g., on opposing sides of the network device chassis 105) and may be telescopically provided within corresponding outer rails.

As further shown in FIG. 1B, the fan module 110 may be connected to the rear portions of the components supported by the upper network device chassis 105 and the lower network device chassis 105. The fan module 110 may include multiple replaceable fan trays that cool the components supported by the upper network device chassis 105 and the lower network device chassis 105. In order to service or replace a fan tray of the fan module 110 of the upper network device chassis 105 or the lower network device chassis 105, the rear access door may be opened to expose the fan module 110 of the upper network device chassis 105 or the lower network device chassis 105.

Figure 1C:
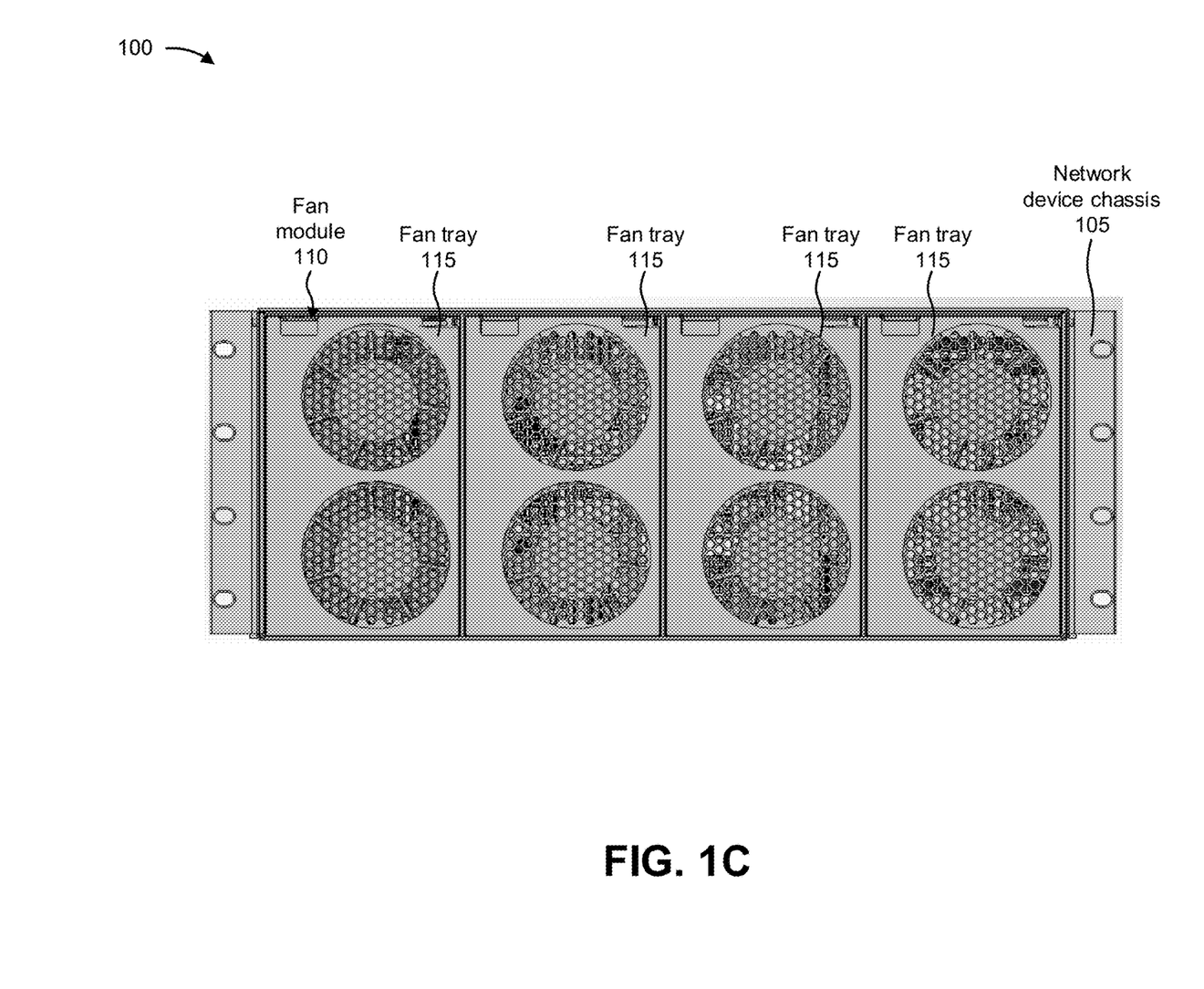

FIG. 1C depicts a rear portion of the network device chassis 105 and the fan module 110 of FIGS. 1A and 1B. As shown, the fan module 110 may include multiple fan trays 115, such as four fan trays 115. In some implementations, the fan module 110 may include more than four fan trays 115, less than four fan trays 115, and/or the like. The quantity of the fan trays 115 provided in the fan module 110 may depend on sizes and shapes of the network device chassis 105, the fan module 110, and/or the fan trays 115. Further details of the fan module 110 and the fan trays 115 are provided elsewhere herein.

Figure 1D:
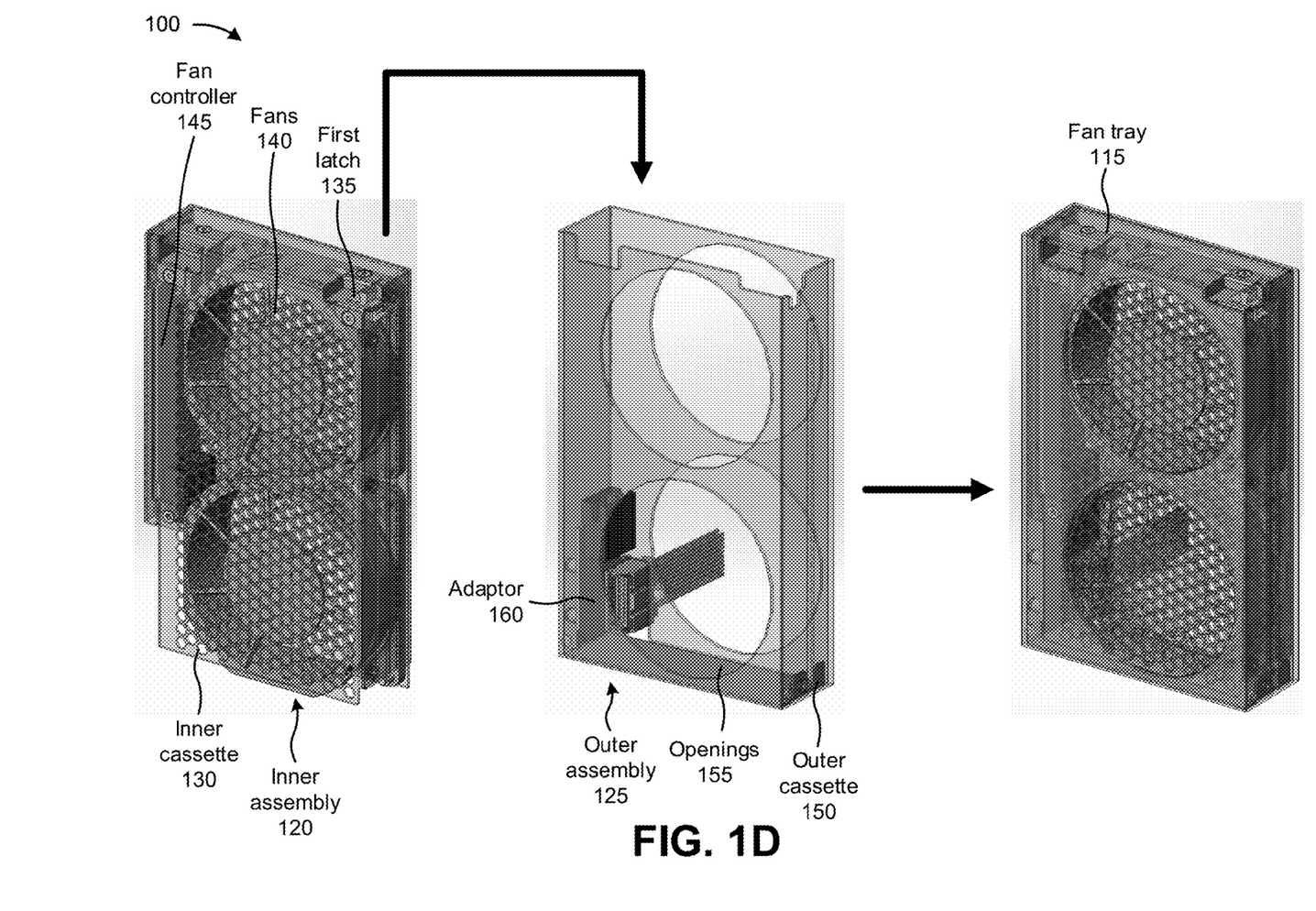

As shown in FIG. 1D, the fan tray 115 may include an inner assembly 120 and an outer assembly 125 sized and shaped to receive and retain the inner assembly 120. As further shown in FIG. 1D, the inner assembly 120 may be provided in a top portion of the outer assembly 125 to form the fan tray 115. The inner assembly 120 may include an inner cassette 130, a first latch 135, fans 140, and a fan controller 145. The outer assembly 125 may include an outer cassette 150, openings 155 in the outer cassette 150, and an adaptor 160.

The inner cassette 130 may support the first latch 135, the fans 140, and the fan controller 145 and may be made from a variety of materials, such as a metal, a plastic, and/or the like. The inner cassette 130 may be sized and shaped based on sizes and shapes of the network device chassis 105 and/or the fan module 110. In some implementations, two sides of the inner cassette 130 may include perforations so that air flow may be generated by the fans 140 and provided to cool the components supported by the network device chassis 105.

The first latch 135 may include a slide latch that engages a portion of the outer assembly 125, in a closed position (e.g., slid toward the outer assembly 125), to retain the inner assembly 120 within the outer assembly 125. When the first latch 135 is provided in an open position (e.g., slid away from the outer assembly 125), the inner assembly 120 may be vertically removable from the top portion of the outer assembly 125.

The fan 140 may include a device that draws cooler air from the outside toward the components supported by the network device chassis 105 to cool the components, a device that expels warm air from the components supported by the network device chassis 105, toward the outside, to cool the components, and/or the like. In some implementations, one of the fans 140 may draw the cooler air from the outside toward the components supported by the network device chassis 105 and another one of the fans 140 may expel the warm air from the components supported by the network device chassis 105. The fans 140 may be sized and shaped based on sizes and shapes of the network device chassis 105 and/or the fan module 110. Although two fans 140 are shown in FIG. 1D, more than two fans 140 or less than two fans 140 may be provided in the inner assembly 120 in some implementations.

The fan controller 145 may include a computing device (e.g., a printed circuit board) that controls operation of the fans 140. For example, the fan controller 145 may control the speeds of the fans 140, the rotational directions of the fans 140, and/or the like.

The outer cassette 150 may support the inner assembly 120 (e.g., when provided within the outer assembly 125) and the adaptor 160, and may be made from a variety of materials, such as a metal, a plastic, and/or the like. The outer cassette 150 may be sized and shaped based on sizes and shapes of the network device chassis 105 and/or the fan module 110. In some implementations, two sides of the outer cassette 150 may include the openings 155 so that air flow may be generated by the fans 140 and provided to cool the components supported by the network device chassis 105. The openings 155 may be sized and shaped to match or substantially match the sizes and shapes of the fans 140.

The adaptor 160 may include a computing device (e.g., a printed circuit board) that is configured to provide power to the fan controller 145 of the inner assembly 120 and to connect and communicate with the fan controller 145. The adaptor 160 may include a cable assembly that communicates with the components supported by the network device chassis 105 to control operation of the fans 140. For example, the components (e.g., via the fan controller 145, the adaptor, and the cable assembly) may control the speeds of the fans 140, the rotational directions of the fans 140, and/or the like.

Figure 1E:
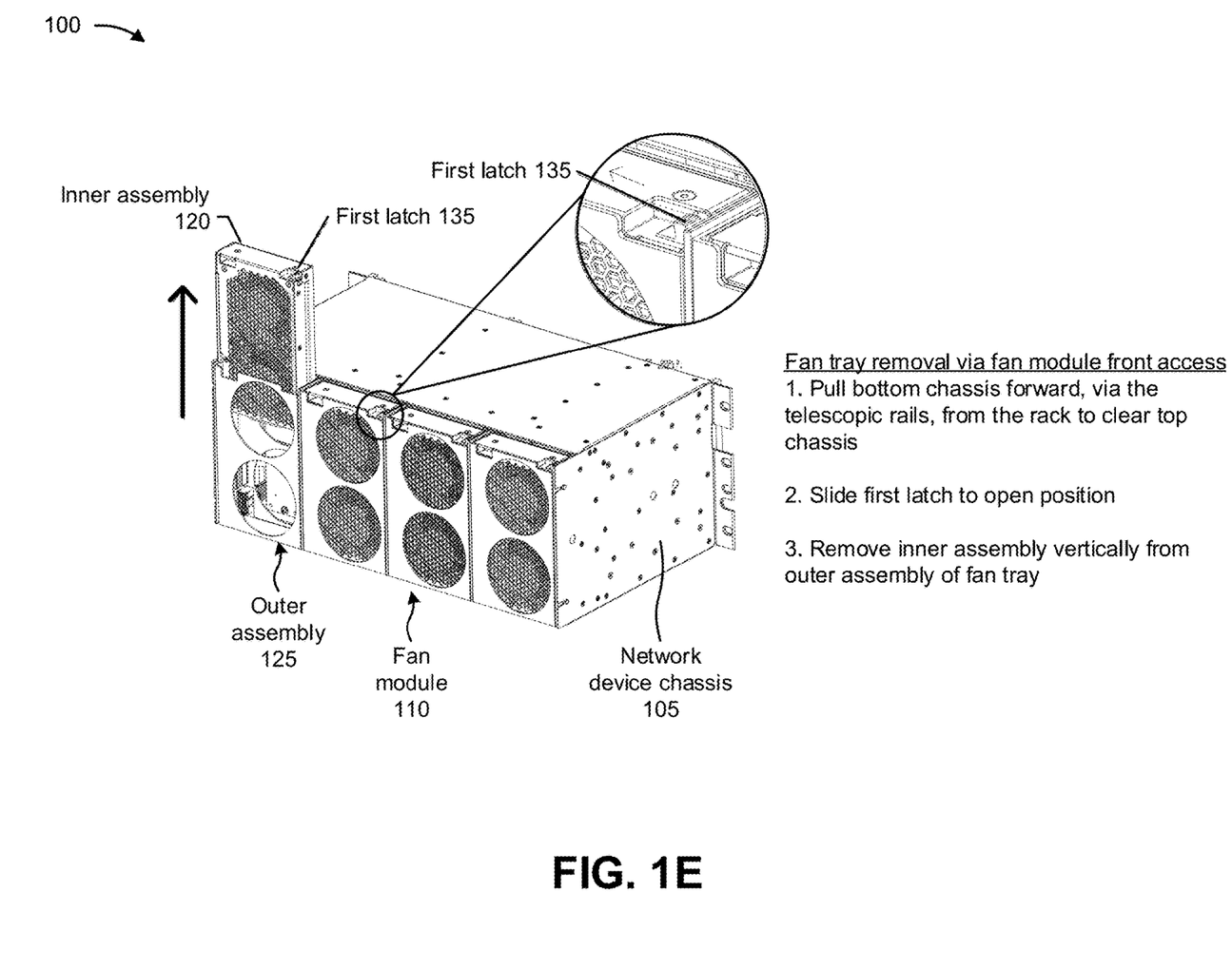

FIG. 1E depicts a process of removing the inner assembly 120 of the fan tray 115 from the fan module 110 when the network device chassis 105 is mounted inside the closed cabinet using telescopic rails and without rear access to the components supported by the network device chassis 105. With reference to FIGS. 1A and 1E, the network device chassis 105 may be a bottom network device chassis 105 and may be pulled forward away from a top network device chassis 105 (not shown in FIG. 1E), via the telescopic inner rails, until the fan module 110 clears the top network device chassis 105. The first latch 135 of the inner assembly 120 may be slid to an open position (e.g., slid away from the outer assembly 125), and the inner assembly 120 may be vertically removed from the outer assembly 125 of the fan tray 115.

In some implementations, the removed inner assembly 120 may be serviced and returned to the outer assembly 125. The first latch 135 may be slid to a closed position (e.g., slid toward the outer assembly 125) to retain the serviced inner assembly 120 within the outer assembly 125. Alternatively, a replacement inner assembly 120 may be provided in the outer assembly 125, and the first latch 135 may be slid to the closed position to retain the replacement inner assembly 120 within the outer assembly 125. In this way, the fan module 110 may be serviced without disabling the components supported by the network device chassis 105.

Figure 1F:
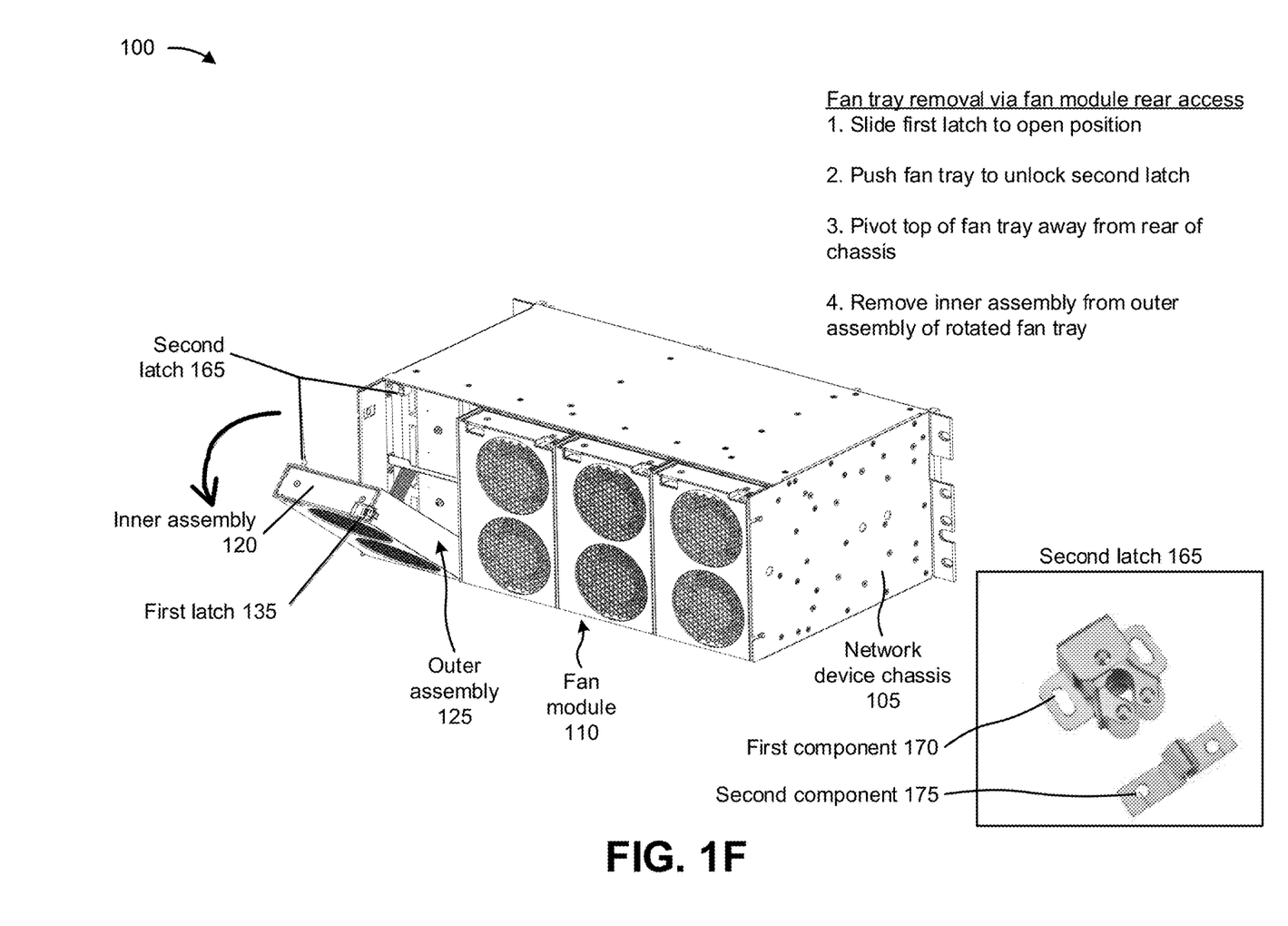

FIG. 1F depicts a process of removing the inner assembly 120 of the fan tray 115 from the fan module 110 when the network device chassis 105 is mounted inside the closed cabinet with rear access (e.g., via the rear access door) to the components supported by the network device chassis 105. With reference to FIGS. 1B and 1F, the rear access door may be opened to provide access to the network device chassis 105. The first latch 135 of the inner assembly 120 may be slid to an open position (e.g., slid away from the outer assembly 125). As further shown in FIG. 1F, a second latch 165 may be provided and may include a first component 170 connected to a rear portion of the network device chassis 105 and a second component 175 connected to the outer assembly 125. In some implementations, the second latch 165 may include a touch latch that is provided in an open position when the second component 175 is forced toward and released from the first component 170. When the second latch 165 is provided in the open position, a top portion of the outer assembly 125 is pivotable away from the rear portion of the network device chassis 105. The second latch 165 may be provided in a closed position when second component 175 is retained by the first component 170. When the second latch 165 is provided in the closed position, the top portion of the outer assembly 125 is retained by the rear portion of the network device chassis 105.

As further shown in FIG. 1F, the outer assembly 125 of the fan tray 115 may be pushed to place the second latch 165 in the open position (e.g., to unlock the second latch 165). The top portion of the outer assembly 125 may be pivoted away from the rear portion of the network device chassis 105. While in the pivoted position, the inner assembly 120 may be removed from the outer assembly 125 of the fan tray 115. In some implementations, the removed inner assembly 120 may be serviced and returned to the outer assembly 125. The outer assembly 125 may be pivoted toward the rear portion of the network device chassis 105 until the second latch 165 is in the closed position. The first latch 135 may be slid to the closed position (e.g., slid toward the outer assembly 125) to retain the serviced inner assembly 120 within the outer assembly 125. Alternatively, a replacement inner assembly 120 may be provided in the outer assembly 125, and the outer assembly 125 may be pivoted toward the rear portion of the network device chassis 105 until the second latch 165 is in the closed position. The first latch 135 may be slid to the closed position to retain the replacement inner assembly 120 within the outer assembly 125. In this way, the fan module 110 may be serviced without disabling the components supported by the network device chassis 105.

In this way, a pivotable removable fan module 110 may be provided for a rackmount network device chassis 105. For example, the pivotable removable fan module 110 may support both a closed cabinet with telescopic rails and without rear access to the fan module 110 and a closed cabinet with rear access to the fan module 110. For the closed cabinet with the telescopic rails and without rear access to the fan module 110, the network device chassis 105 may be moved forward, via the telescopic rails, from a rack until a top of the fan module 110 is accessible. The fan tray 115 of the fan module 110 may be vertically removed and replaced via the top of the fan module 110. For a closed cabinet with rear access to the fan module 110, the fan tray 115 of the fan module 110 may be pivoted away from a rear portion of the network device chassis 105 and may be removed and replaced via the rear of the fan module 110. Thus, the pivotable removable fan module 110 prevents a delay in replacing and/or servicing the fan module 110 and conserves computing resources, networking resources, and/or the like that would otherwise have been consumed by delaying traffic transmission through a network while the fan module 110 is being replaced and/or serviced, losing traffic due to the delay in replacing and/or servicing the fan module 110, handling lost traffic due to the delay in replacing and/or servicing the fan module 110, increasing costs of parts, inventory, and labor associated with supporting two different cabinet configurations, and/or the like.

As indicated above, FIGS. 1A-1F are provided as an example. Other examples may differ from what is described with regard to FIGS. 1A-1F. The number and arrangement of devices shown in FIGS. 1A-1F are provided as an example. In practice, there may be additional devices, fewer devices, different devices, or differently arranged devices than those shown in FIGS. 1A-1F. Furthermore, two or more devices shown in FIGS. 1A-1F may be implemented within a single device, or a single device shown in FIGS. 1A-1F may be implemented as multiple, distributed devices. Additionally, or alternatively, a set of devices (e.g., one or more devices) shown in FIGS. 1A-1F may perform one or more functions described as being performed by another set of devices shown in FIGS. 1A-1F.

Figure 2:
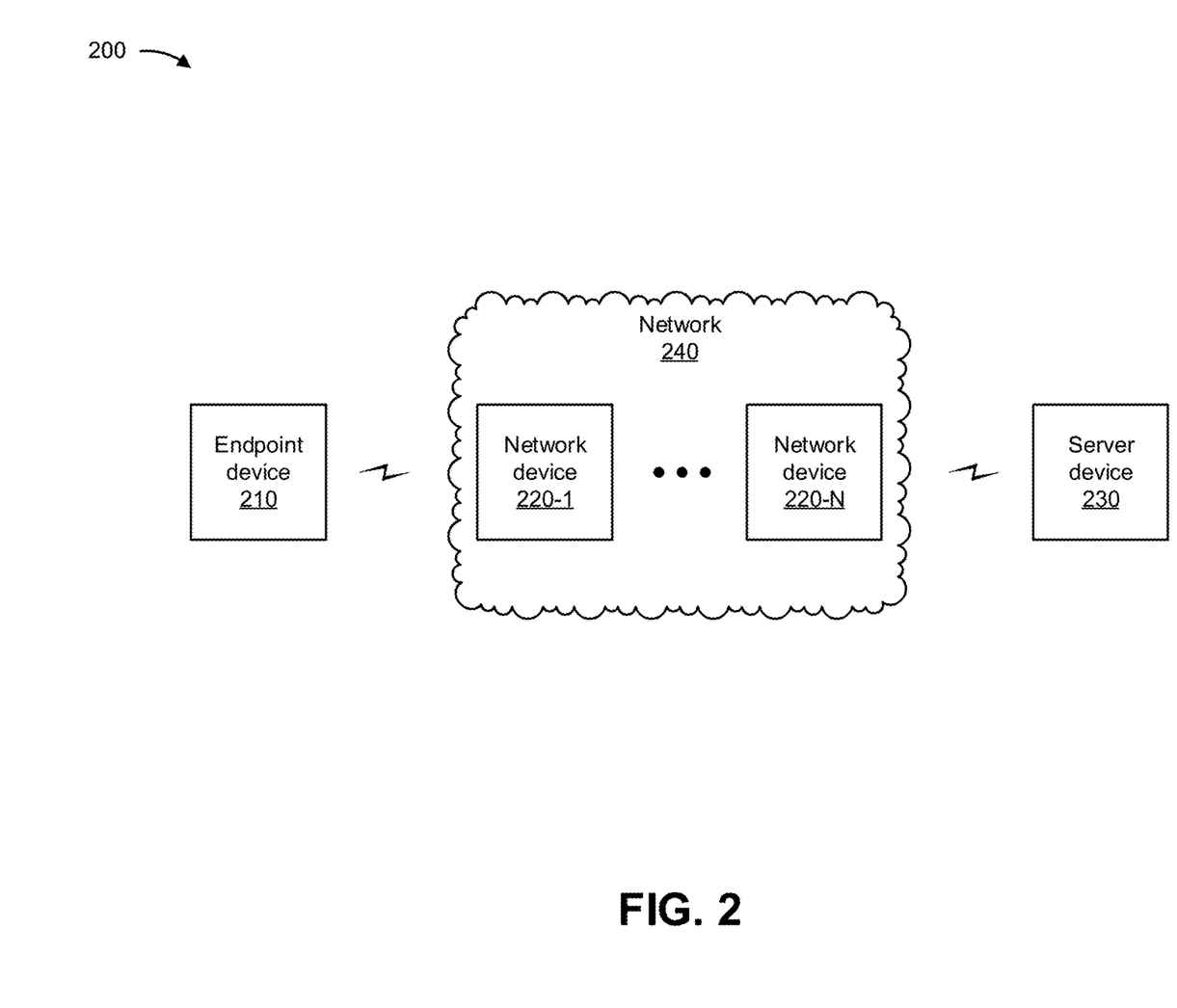
FIG. 2 is a diagram of an example environment in which systems and/or methods described herein may be implemented.

FIG. 2 is a diagram of an example environment 200 in which systems and/or methods described herein may be implemented. As shown in FIG. 2, the environment 200 may include an endpoint device 210, a group of network devices 220 (shown as network device 220-1 through network device 220-N), a server device 230, and a network 240. Devices of the environment 200 may interconnect via wired connections, wireless connections, or a combination of wired and wireless connections. In some implementations, the network devices 220 may be provided in the network device chassis 105 described above in connection with FIGS. 1A and 1B.

The endpoint device 210 includes one or more devices capable of receiving, generating, storing, processing, and/or providing information, such as information described herein. For example, the endpoint device 210 may include a mobile phone (e.g., a smart phone or a radiotelephone), a laptop computer, a tablet computer, a desktop computer, a handheld computer, a gaming device, a wearable communication device (e.g., a smart watch, a pair of smart glasses, a heart rate monitor, a fitness tracker, smart clothing, smart jewelry, or a head mounted display), a network device, or a similar type of device. In some implementations, the endpoint device 210 may receive network traffic from and/or may provide network traffic to other endpoint devices 210 and/or the server device 230, via the network 240 (e.g., by routing packets using the network devices 220 as intermediaries).

The network device 220 includes one or more devices capable of receiving, processing, storing, routing, and/or providing traffic (e.g., a packet or other information or metadata) in a manner described herein. For example, the network device 220 may include a router, such as a label switching router (LSR), a label edge router (LER), an ingress router, an egress router, a provider router (e.g., a provider edge router or a provider core router), a virtual router, or another type of router. Additionally, or alternatively, the network device 220 may include a gateway, a switch, a firewall, a hub, a bridge, a reverse proxy, a server (e.g., a proxy server, a cloud server, or a data center server), a load balancer, and/or a similar device. In some implementations, the network device 220 may be a physical device implemented within a housing, such as a chassis. In some implementations, the network device 220 may be a virtual device implemented by one or more computer devices of a cloud computing environment or a data center. In some implementations, a group of network devices 220 may be a group of data center nodes that are used to route traffic flow through the network 240.

The server device 230 includes one or more devices capable of receiving, generating, storing, processing, and/or providing information, such as information described herein. For example, the server device 230 may include a laptop computer, a tablet computer, a desktop computer, a group of server devices, or a similar type of device, associated with multicast traffic. In some implementations, the server device 230 may receive information from and/or transmit information (e.g., multicast traffic) to the endpoint device 210, via the network 240 (e.g., by routing packets using the network devices 220 as intermediaries).

The network 240 includes one or more wired and/or wireless networks. For example, the network 240 may include a packet switched network, a cellular network (e.g., a fifth generation (5G) network, a fourth generation (4G) network, such as a long-term evolution (LTE) network, a third generation (3G) network, a code division multiple access (CDMA) network, a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the environment 200 may perform one or more functions described as being performed by another set of devices of the environment 200.

Figure 3:
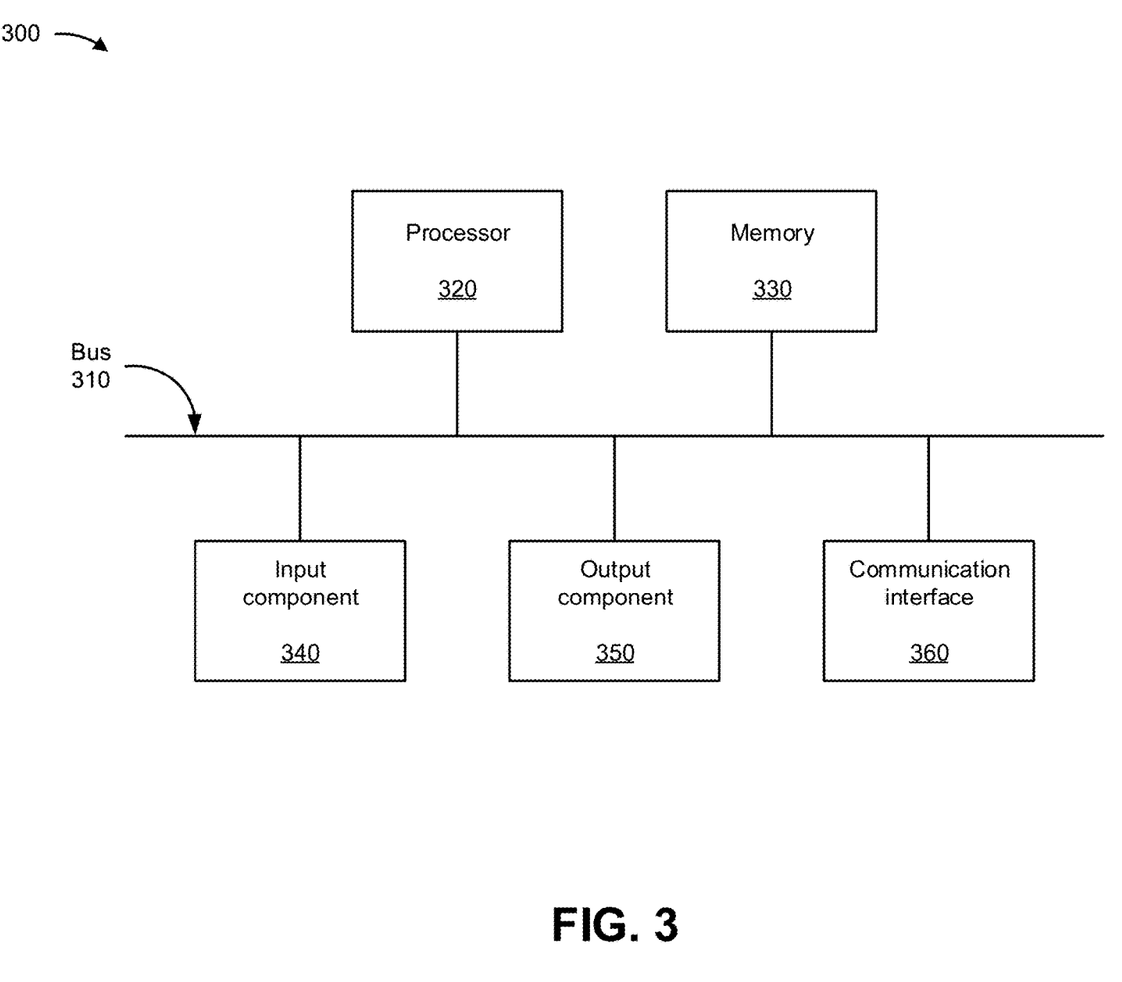
FIGS. 3 and 4 are diagrams of example components of one or more devices of FIG. 2.

FIG. 3 is a diagram of example components of one or more devices of FIG. 2. The example components may be included in a device 300, which may correspond to the endpoint device 210, the network device 220, and/or the server device 230. In some implementations, the endpoint device 210, the network device 220, and/or the server device 230 may include one or more devices 300 and/or one or more components of the device 300. As shown in FIG. 3, the device 300 may include a bus 310, a processor 320, a memory 330, an input component 340, an output component 350, and a communication interface 360.

The bus 310 includes one or more components that enable wired and/or wireless communication among the components of the device 300. The bus 310 may couple together two or more components of FIG. 3, such as via operative coupling, communicative coupling, electronic coupling, and/or electric coupling. The processor 320 includes a central processing unit, a graphics processing unit, a microprocessor, a controller, a microcontroller, a digital signal processor, a field-programmable gate array, an application-specific integrated circuit, and/or another type of processing component. The processor 320 is implemented in hardware, firmware, or a combination of hardware and software. In some implementations, the processor 320 includes one or more processors capable of being programmed to perform one or more operations or processes described elsewhere herein.

The memory 330 includes volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 stores information, instructions, and/or software (e.g., one or more software applications) related to the operation of the device 300. In some implementations, the memory 330 includes one or more memories that are coupled to one or more processors (e.g., the processor 320), such as via the bus 310.

The input component 340 enables the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 enables the device 300 to provide output, such as via a display, a speaker, and/or a light-emitting diode. The communication interface 360 enables the device 300 to communicate with other devices via a wired connection and/or a wireless connection. For example, the communication interface 360 may include a receiver, a transmitter, a transceiver, a modem, a network interface card, and/or an antenna.

The device 300 may perform one or more operations or processes described herein. For example, a non-transitory computer-readable medium (e.g., the memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry may be used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

Figure 4:
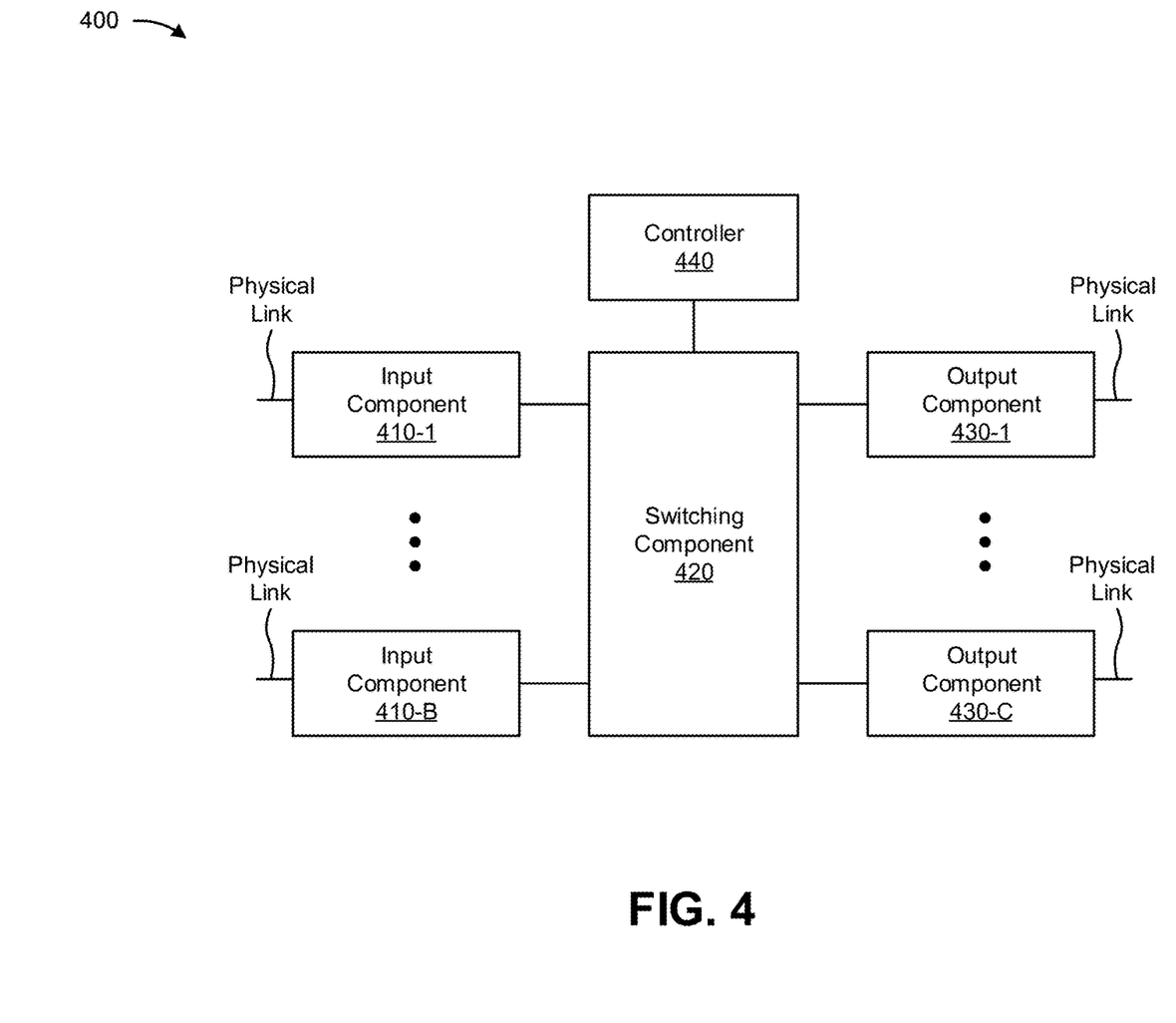

FIG. 4 is a diagram of example components of one or more devices of FIG. 2. The example components may be included in a device 400. The device 400 may correspond to the network device 220. In some implementations, the network device 220 may include one or more devices 400 and/or one or more components of the device 400. As shown in FIG. 4, the device 400 may include one or more input components 410-1 through 410-B (B≥1) (hereinafter referred to collectively as input components 410, and individually as input component 410), a switching component 420, one or more output components 430-1 through 430-C (C≥1) (hereinafter referred to collectively as output components 430, and individually as output component 430), and a controller 440.

The input component 410 may be one or more points of attachment for physical links and may be one or more points of entry for incoming traffic, such as packets. The input component 410 may process incoming traffic, such as by performing data link layer encapsulation or decapsulation. In some implementations, the input component 410 may transmit and/or receive packets. In some implementations, the input component 410 may include an input line card that includes one or more packet processing components (e.g., in the form of integrated circuits), such as one or more interface cards (IFCs), packet forwarding components, line card controller components, input ports, processors, memories, and/or input queues. In some implementations, the device 400 may include one or more input components 410.

The switching component 420 may interconnect the input components 410 with the output components 430. In some implementations, the switching component 420 may be implemented via one or more crossbars, via busses, and/or with shared memories. The shared memories may act as temporary buffers to store packets from the input components 410 before the packets are eventually scheduled for delivery to the output components 430. In some implementations, the switching component 420 may enable the input components 410, the output components 430, and/or the controller 440 to communicate with one another.

The output component 430 may store packets and may schedule packets for transmission on output physical links. The output component 430 may support data link layer encapsulation or decapsulation, and/or a variety of higher-level protocols. In some implementations, the output component 430 may transmit packets and/or receive packets. In some implementations, the output component 430 may include an output line card that includes one or more packet processing components (e.g., in the form of integrated circuits), such as one or more IFCs, packet forwarding components, line card controller components, output ports, processors, memories, and/or output queues. In some implementations, the device 400 may include one or more output components 430. In some implementations, the input component 410 and the output component 430 may be implemented by the same set of components (e.g., and input/output component may be a combination of the input component 410 and the output component 430).

The controller 440 includes a processor in the form of, for example, a CPU, a GPU, an APU, a microprocessor, a microcontroller, a DSP, an FPGA, an ASIC, and/or another type of processor. The processor is implemented in hardware, firmware, or a combination of hardware and software. In some implementations, the controller 440 may include one or more processors that can be programmed to perform a function.

In some implementations, the controller 440 may include a RAM, a ROM, and/or another type of dynamic or static storage device (e.g., a flash memory, a magnetic memory, an optical memory, etc.) that stores information and/or instructions for use by the controller 440.

In some implementations, the controller 440 may communicate with other devices, networks, and/or systems connected to the device 400 to exchange information regarding network topology. The controller 440 may create routing tables based on the network topology information, may create forwarding tables based on the routing tables, and may forward the forwarding tables to the input components 410 and/or output components 430. The input components 410 and/or the output components 430 may use the forwarding tables to perform route lookups for incoming and/or outgoing packets.

The controller 440 may perform one or more processes described herein. The controller 440 may perform these processes in response to executing software instructions stored by a non-transitory computer-readable medium. A computer-readable medium is defined herein as a non-transitory memory device. A memory device includes memory space within a single physical storage device or memory space spread across multiple physical storage devices.

Software instructions may be read into a memory and/or storage component associated with the controller 440 from another computer-readable medium or from another device via a communication interface. When executed, software instructions stored in a memory and/or storage component associated with the controller 440 may cause the controller 440 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, the device 400 may include additional components, fewer components, different components, or differently arranged components than those shown in FIG. 4. Additionally, or alternatively, a set of components (e.g., one or more components) of the device 400 may perform one or more functions described as being performed by another set of components of the device 400.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A fan tray for a fan module of a network device chassis, the fan tray comprising:
    an inner assembly that includes:
        an inner cassette,
        one or more fans connected to the inner cassette,
        a first latch connected to the inner cassette and configured to removably connect to an outer assembly of the fan tray, and
        a fan controller connected to the inner cassette and configured to control operation of the one or more fans; and
    the outer assembly being configured to receive and retain the inner assembly, the outer assembly including:
        an outer cassette with one or more openings configured to communicate with the one or more fans,
        a second latch connected to the outer cassette and configured to removably connect to a rear portion of the network device chassis, and
        an adaptor connected to the outer cassette and configured to connect and provide power to the fan controller.

2. The fan tray of claim 1, wherein the second latch is a touch latch.

3. The fan tray of claim 1, wherein, when the first latch is provided in an open position, the inner assembly is vertically removable from a top portion of the outer assembly.

4. The fan tray of claim 1, wherein, when the first latch is provided in a closed position, the inner assembly is retained within the outer assembly.

5. The fan tray of claim 1, wherein, when the second latch is provided in an open position, a top portion of the outer assembly is pivotable away from the rear portion of the network device chassis.

6. The fan tray of claim 1, wherein, when the second latch is provided in a closed position, a top portion of the outer assembly is retained by the rear portion of the network device chassis.

7. The fan tray of claim 1, wherein the adaptor is configured to connect to a network device provided in the network device chassis.

8. A chassis, comprising:
    one or more components of a network device; and
    a fan module that includes a plurality of fan trays, wherein each of the fan trays includes:
  an inner assembly that includes:
    an inner cassette,
    one or more fans connected to the inner cassette,
    a first latch connected to the inner cassette and configured to removably connect to an outer assembly of the fan tray, and
    a fan controller connected to the inner cassette and configured to control operation of the one or more fans; and
  the outer assembly being configured to receive and retain the inner assembly, the outer assembly including:
    an outer cassette with one or more openings configured to communicate with the one or more fans,
    a second latch connected to the outer cassette and configured to removably connect to a rear portion of the chassis, and
    an adaptor connected to the outer cassette and configured to connect and provide power to the fan controller.

9. The chassis of claim 8, wherein the second latch is a touch latch.

10. The chassis of claim 8, wherein, when the first latch is provided in an open position, the inner assembly is vertically removable from a top portion of the outer assembly.

11. The chassis of claim 8, wherein, when the first latch is provided in a closed position, the inner assembly is retained within the outer assembly.

12. The chassis of claim 8, wherein, when the second latch is provided in an open position, a top portion of the outer assembly is pivotable away from the rear portion of the chassis.

13. The chassis of claim 8, wherein, when the second latch is provided in a closed position, a top portion of the outer assembly is retained by the rear portion of the chassis.

14. The chassis of claim 8, wherein the adaptor is configured to connect to the one or more components of the network device.

15. A fan module of a network device chassis, the fan module comprising:
  a plurality of fan trays, wherein each of the fan trays includes:
    an inner assembly that includes:
      an inner cassette,
      one or more fans connected to the inner cassette,
      a first latch connected to the inner cassette and configured to removably connect to an outer assembly of the fan tray, and
      a fan controller connected to the inner cassette and configured to control operation of the one or more fans; and
    the outer assembly being configured to receive and retain the inner assembly, the outer assembly including:
      an outer cassette with one or more openings configured to communicate with the one or more fans,
      a second latch connected to the outer cassette and configured to removably connect to a rear portion of the network device chassis, and
      an adaptor connected to the outer cassette and configured to connect and provide power to the fan controller.

16. The fan module of claim 15, wherein the second latch is a touch latch.

17. The fan module of claim 15, wherein, when the first latch is provided in an open position, the inner assembly is vertically removable from a top portion of the outer assembly.

18. The fan module of claim 15, wherein, when the first latch is provided in a closed position, the inner assembly is retained within the outer assembly.

19. The fan module of claim 15, wherein, when the second latch is provided in an open position, a top portion of the outer assembly is pivotable away from the rear portion of the network device chassis.

20. The fan module of claim 15, wherein, when the second latch is provided in a closed position, a top portion of the outer assembly is retained by the rear portion of the network device chassis.

* * * * *